(12) United States Patent
Oz et al.

(10) Patent No.: US 10,314,162 B1
(45) Date of Patent: Jun. 4, 2019

(54) APPARATUSES AND METHODS FOR IMPROVED NETWORK CONNECTIONS

(71) Applicant: Mellanox Technologies, Ltd., Yokneam (IL)

(72) Inventors: Dor Oz, Tel Aviv (IL); Uri Goffer-Dor, Alonei Aba (IL); Boris Sharav, Hadera (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 0 days.

(21) Appl. No.: 16/034,492

(22) Filed: Jul. 13, 2018

(51) Int. Cl.
| | |
|---|---|
| *H05K 1/11* | (2006.01) |
| *H05K 3/40* | (2006.01) |
| *H05K 1/02* | (2006.01) |
| *H05K 1/18* | (2006.01) |
| *H05K 3/34* | (2006.01) |
| *H01R 12/72* | (2011.01) |

(52) U.S. Cl.
CPC ......... *H05K 1/0216* (2013.01); *H01R 12/722* (2013.01); *H05K 1/11* (2013.01); *H05K 1/111* (2013.01); *H05K 1/18* (2013.01); *H05K 3/34* (2013.01); *H05K 3/4007* (2013.01); *H05K 2201/09227* (2013.01); *H05K 2201/09418* (2013.01); *H05K 2201/10189* (2013.01); *H05K 2201/10356* (2013.01)

(58) Field of Classification Search
CPC ...... H05K 3/403; H05K 3/4007; H05K 1/111; H05K 1/117
See application file for complete search history.

(56) References Cited

FOREIGN PATENT DOCUMENTS

EP       0557081 A1 *  8/1993  ............. H01R 12/57

OTHER PUBLICATIONS

"LinkX 100Gb/s Passive Copper Cables", Mellanox Technologies, Cables Product Brief, (dated 2015).

* cited by examiner

*Primary Examiner* — Jeremy C Norris
(74) *Attorney, Agent, or Firm* — Alston & Bird LLP (57) ABSTRACT

Apparatuses and associated methods are described that provide networking connections that reduce cross-talk and other interference in communications systems. The network connection includes a printed circuit board (PCB) that defines a first end, a second end, and a grounding region on a surface of the PCB proximate the first end. The network connection includes network connectors proximate the first end, soldering pad pairs proximate the second end, and electrical traces therebetween. At least a first soldering pad pair is offset from a second soldering pad pair with respect to an edge of the PCB at the second end, such that, in an operational configuration in which at least the first soldering pad pair and the second soldering pad pair receive a differential signal cable, each differential signal cable is supported by the PCB in a corresponding offset configuration thereby reducing cross-talk between the differential signal cables.

20 Claims, 5 Drawing Sheets

APPARATUSES AND METHODS FOR IMPROVED NETWORK CONNECTIONS

TECHNOLOGICAL FIELD

Example embodiments of the present invention relate generally to communications systems and, more particularly, to reducing cross-talk and other interference in network connections.

BACKGROUND

A consistent demand for increased data transmission rates, increased bandwidth density, enhanced capacity, and the like exists for datacenters and other related communications systems. This demand is often accompanied by a need to optimize the physical space found within elements of communications systems, such as datacenter racks, in order to maximum the quantity of circuitry housed therein.

As the space between electronic components (e.g., networking wires, electrical traces, etc.) is reduced, the likelihood of electrical or other related interference (e.g., cross-talk) is increased. The existence of cross-talk between elements in communications systems often results in degradation to the signal transmitted by these elements.

BRIEF SUMMARY

Substrate assemblies, network connection assemblies, and associated methods of manufacturing are provided herein for providing improved network connection. In one embodiment, with reference to the claimed substrate assembly, a substrate assembly for a network connection is provided. The assembly may include a printed circuit board (PCB), and the PCB may define a first end, a second end, and at least one grounding region on the PCB proximate the second end. The assembly may further include a plurality of network connectors disposed on the PCB proximate the first end of the PCB, and each network may be configured to receive a corresponding networking device connected thereto. The assembly may also include a plurality of soldering pad pairs disposed on the PCB proximate the second end of the PCB, and each soldering pad pair may be configured to receive a differential signal cable such that each soldering pad in the soldering pad pair receives a signal wire of the differential signal cable attached thereto. The assembly may further include a plurality of electrical traces defined by the PCB, and each electrical trace is configured to provide electrical communication between a network connector and a corresponding soldering pad such that electrical signals may pass therebetween. The first soldering pad pair may be offset from a second soldering pad pair with respect to an edge of the PCB at the second end, such that, in an operational configuration in which at least the first soldering pad pair and the second soldering pad pair receive a differential signal cable, each differential signal cable is supported by the PCB in a corresponding offset configuration thereby reducing cross-talk between the differential signal cables.

In some embodiments in which the PCB defines at least a first extension supporting the first soldering pad pair and a second extension supporting the second soldering pad pair, the first extension and the second extension may be located such that at least a portion of the at least one grounding region proximate the second end is disposed between the first extension and the second extension.

In such an embodiment, the first extension may define a first length and the second extension may define a second length. In some cases, the first length may be greater than the second length.

In some other embodiments, the assembly may include one or more drain wires connected between each differential signal cable and the at least one grounding region proximate the second end. In such an embodiment, at least one of the one or more drain wires of the differential signal cable received by the first soldering pad pair or the differential signal cable received by the second soldering pad pair may be connected to the grounding region between the first extension and the second extension.

In some cases, the distance between corresponding soldering pads of the first soldering pad pair and the second soldering pad pair is approximately 1.4 mm.

In other cases, the PCB may further include a first surface supporting the plurality of network connectors disposed proximate the first end of the PCB and supporting the plurality of soldering pad pairs disposed proximate the second end of the PCB. The PCB may further include a second surface opposite the first surface, the second surface supporting a plurality of network connectors disposed on the second surface of the PCB proximate the first end of the PCB and supporting a plurality of soldering pad pairs disposed on the second surface of the PCB proximate the second end of the PCB.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components than those shown in the figures.

DETAILED DESCRIPTION

Overview

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances. As used herein, "soldering pads" and "soldering signal pads" may be used interchangeably to refer to portions of a printed circuit board configured to provide electrical communication between elements attached thereto (e.g. between signal wire and electrical traces)

As discussed herein, the example embodiment may be described with reference to a passive copper cable (PCC) as a suitable medium for transmission (e.g., a differential signal cable or other networking cable). However, the present disclosure may be equally applicable for use with any networking cable (e.g., direct attach copper (DAC), active copper cable (ACC), or the like) or interconnect utilized by datacenter racks and associated switch modules (e.g., a Small Form Pluggable (SFP), quad small form-factor pluggable (QSFP), or the like).

Various different types of connectors also exist for enabling transmission of signals between switch modules and other equipment in a datacenter. For example, Quad Small Form-factor Pluggable (QSFP) connectors and cables, as well as other forms of connectors such as Small Form Pluggable (SFP) and C-Form-factor Pluggable (CFP) connectors, have long been the industry standard for providing high-speed information operations interface interconnects. More recently, Octal Small Form-factor Pluggable (OSFP) transceivers have been developed to provide increased bit rate capabilities of up to 400 Gbps. As described above, the consistent demand for increased functionality and capacity in communications systems often results in an increase in cross-talk or interference between components. A conventional datacenter rack 100 that is designed to house servers, networking devices, modules, and other datacenter computing equipment and that may be used in conjunction with embodiments of the networking connection assemblies of the present invention is depicted in FIG. 1.

Figure 1:
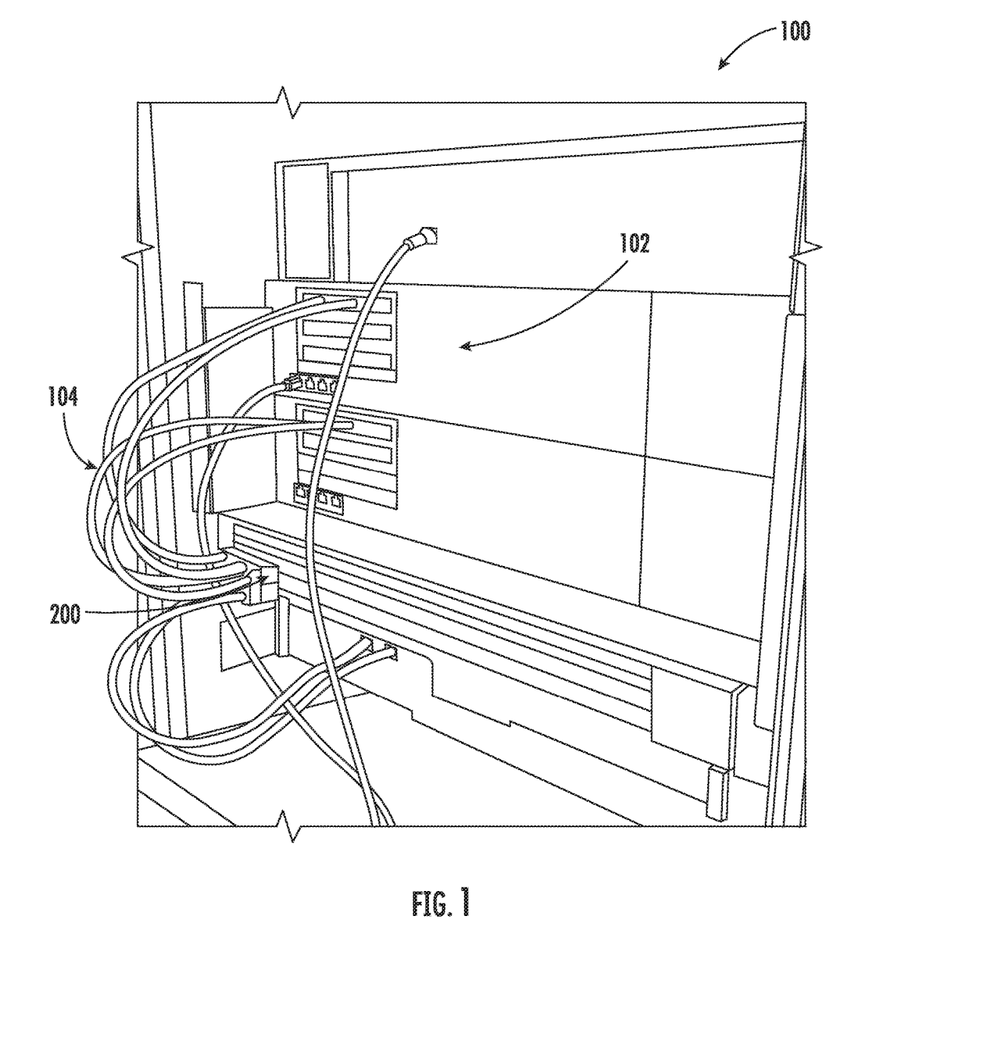
FIG. 1 is a perspective view of a datacenter rack that includes switch modules for use with some embodiments discussed herein.
Figure 1A:
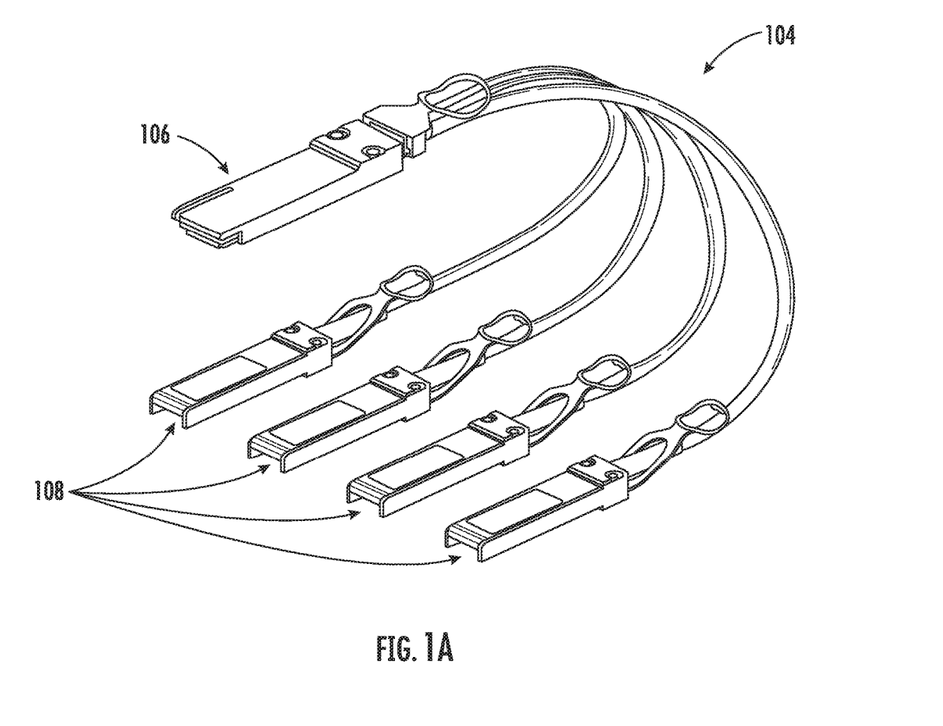
FIG. 1A is a perspective view of an example external networking cable of the datacenter rack of FIG. 1 for use with some embodiments discussed herein.

With reference to FIG. 1, a switch module 102, which may house an application-specific integrated circuit (ASIC) as well as other internal components (not visible), is typically incorporated into a datacenter network via connections to other switch systems, servers, and network components. The switch modules 102 may be configured to be received by a datacenter rack 100 and may be configured to allow for the conversion between electrical signals and optical signals. For example, external networking cables 104 (as shown in FIG. 1A) may carry electrical signals as inputs to the switch module 102. The electrical signals may be received by a network connection assembly 200 that houses a transceiver system (e.g., one or more QSFPs) configured to convert the electrical signals to optical signals. With reference to FIG. 1A, an example external networking cable 104 is illustrated having a QSFP connector 106 connected with four (4) SFP connectors 108. The QSFP connector 106 and SFP connectors 108 may be received by corresponding ports of the switch module 102 as shown in FIG. 1. While illustrated with a QSFP connector 106 and SFP connectors 108, the external networking cable 104 of the present invention may include any combination of networking cables of any type, dimension, or the like as described below.

With continued reference to FIGS. 1-1A, the size of components used in the transmission of data as electrical signals (such as those found in the QSFP 106) is often constrained to meet pre-defined manufacturing specifications (e.g., for consistent sizing amongst components). As would be understood by one of ordinary skill in the art in light of the present disclosure, minimizing interference between components, for example the four (4) connections between the QSFP connector 106 and the SFP connectors 108 of FIG. 1A, while maintaining compliance with these constraints is critical to producing effective network communication components. Accordingly, embodiments of the present invention described herein provide a network connection assembly and associated methods of assembly that reduce cross-talk and other interference between networking cables by utilizing a non-traditional offset grounding spacing to optimize performance of networking communications.

Network Connection Assembly

Figure 2:
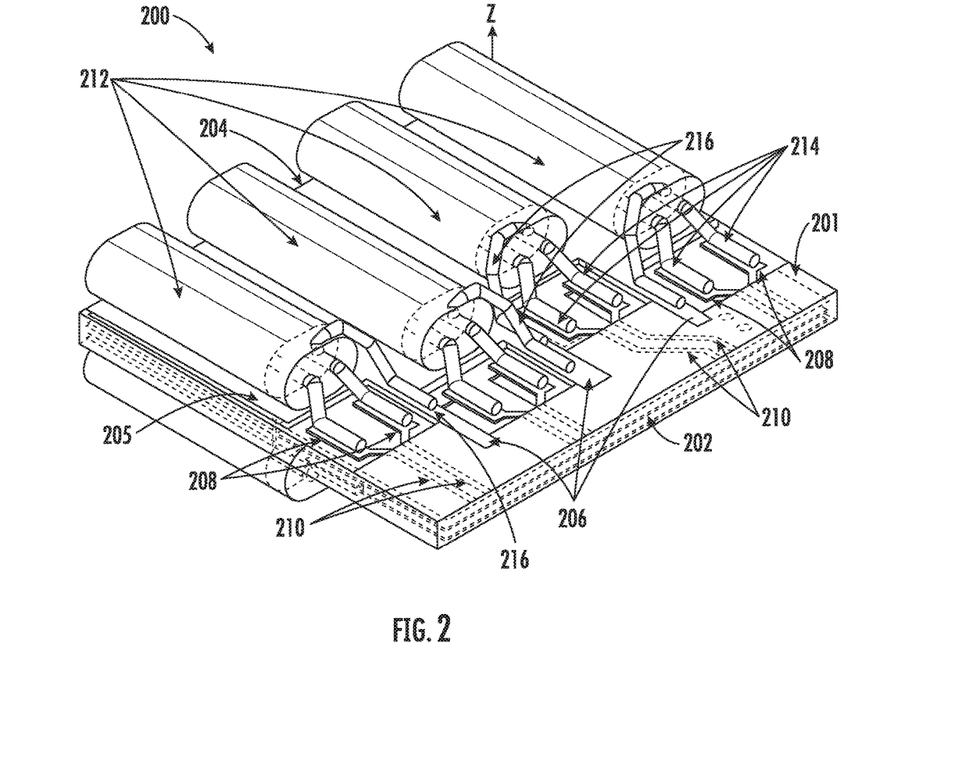
FIG. 2 is a perspective view of a network connection assembly in an operational configuration according to an example embodiment.

With reference to FIG. 2, a perspective view of a network connection assembly 200 is illustrated. As shown, the network connection assembly 200 may include a printed circuit board (PCB) 201 that defines a first end 202, a second end 204, and at least one grounding region 205 on a surface of the PCB 201. The network connection assembly 200 may further include a plurality of network connectors (not shown), a plurality of soldering pad pairs 208, and a plurality of electrical traces 210. The network connection assembly 200 of FIG. 2 is illustrated in an operational configuration in which one or more differential signal cables 212 are received by the second end 204 of the PCB 201.

With continued reference to FIG. 2, the first end 202 of the PCB 201 may be configured to support the plurality of network connectors (not shown) disposed on the surface of the PCB 201. The plurality of network connectors (not shown) may be located proximate the first end 202 of the PCB 201, and each network connector (not shown) may be configured to receive a corresponding networking device therein. The network connectors (e.g. goldfingers, structure for press-fit connectors, etc.) (not shown) may each be configured to connect to a networking device of any type (e.g., QSFP, QSFP-DD, OSFP, SFP, SFP-DD, DSFP, DAC, ACC, etc.), and may thus be dimensioned (e.g., sized and shaped) to mate with or otherwise connect to any corresponding networking device. In the operational configuration illustrated in FIG. 2, the first end 202 of the PCB 201 that supports the plurality of network connectors (not shown) may be inserted in, attached to, or otherwise received by the QSFP connector 106 as shown in FIG. 1A (for receipt by a port in a switch module). While the present disclosure illustrates and describes a networking connection assembly 200 without a housing or other protective casing, as would be understood by one of ordinary skill in the art in light of the present disclosure, some or all of the network connection assembly 200 may be supported or enclosed by any housing used in communications systems to protect the components supported therein (e.g., the QSFP connector 106 housing or the like). Furthermore, while the PCB 201 is illustrated herein as having a substantially rectangular shape defining a first end 202 and a second end 204 opposite the first end 202, the present disclosure contemplates that the PCB 201 may be dimensioned (e.g., sized and shaped) to mate with any communication system regardless of geometric constraints (e.g., L-shaped, squared-shaped, etc.).

With continued reference to FIG. 2, the second end 204 of the PCB 201 may be configured to support a plurality of soldering pad pairs 208 disposed on the surface of the PCB 201. The plurality of soldering pad pairs 208 may be located proximate the second end 204 of the PCB 201, and each soldering pad of the soldering pad pair 208 may be configured to receive a corresponding differential signal cable 212 connected thereto via connection between a pair of signal wires 214 and corresponding solder pads of the soldering pad pair 208. The soldering pads of the soldering pad pairs 208 may each be configured to receive a differential signal cable 212 of any type or material (e.g., copper, aluminum, etc.) and may be dimensioned (e.g., sized and shaped) to provide sufficient space for attachment with the corresponding differential signal cable 212. In the operational configuration, as shown in FIG. 2, in which the first end 202 of the PCB 201 is received by a switch module, the second end 204 of the PCB 201 may extend outward from the switch module and, via the networking cables, may serve to connect the networking connection assembly 200 to another assembly on the opposite end of the networking cable. Said differently, the networking cables may allow electrical signals to be transmitted between networking connection assemblies 200 on opposing ends of a differential signal cable 212 (e.g., as shown in FIG. 1A).

The second end 204 of the PCB 201 may also define at least one grounding region 205 on the surface of the PCB 201 that is proximate the second end 204. As shown in FIG. 2, in some embodiments, the at least one grounding region 205 may extend along the entire second end 204 of the PCB 201, or may partially cover this area. As described further with reference to FIG. 3, the grouping of the soldering pad pairs 208 may be such that the grounding region 205 may define a plurality of grounding regions 206 located between adjacent soldering pad pairs 208. In such an embodiment, the grounding region 205 proximate the second end 204 may be positioned such that each soldering pad pair 208 and corresponding differential signal cable 212 attached thereto (e.g., via the pair of signal wires 214) is adjacent a corresponding grounding region 206. For example, the grounding region 205 may extend between adjacent pairs of soldering pads 208 to define a plurality of regions 206 as shown, or in other cases separate and distinct grounding regions 205 disposed between adjacent soldering pad pairs 208 may be provided. In an operational configuration as shown, the plurality of soldering pad pairs 208 and corresponding differential signal cables 212 may be connected to the grounding region 205 (e.g., in particular the plurality of grounding regions 206) via one or more drain wires 216. In some embodiments, each differential signal cable 212 may use only a single drain wire 216 connected to a corresponding grounding region 206 proximate the second end 204 between adjacent soldering pad pairs 208. As would be understood by one of ordinary skill in the art in light of the present disclosure, the drain wires 216 operate to remove unwanted electrical noise from the differential signal cables 212 to a ground (e.g., the grounding region 206).

With continued reference to FIG. 2, the PCB 201 of the network connector assembly 200 may further define a plurality of electrical traces 210. The electrical traces 210 may be configured to provide electrical communication between a network connector (not shown) and a corresponding differential signal cable 212 attached to a corresponding soldering pad pair 208 (e.g., via signal wires 214) such that electrical signals may pass therebetween. The electrical traces 210 may, in some embodiments be attached to a surface of the PCB 201 or may, in some embodiments, be defined by the surface of the PCB 201. In some embodiments, one or more of the electrical traces 210 may pass between opposite surfaces of the PCB 201, such as by passing through the PCB 201, to enable electrical communication between different surfaces of the PCB 201.

Figure 3:
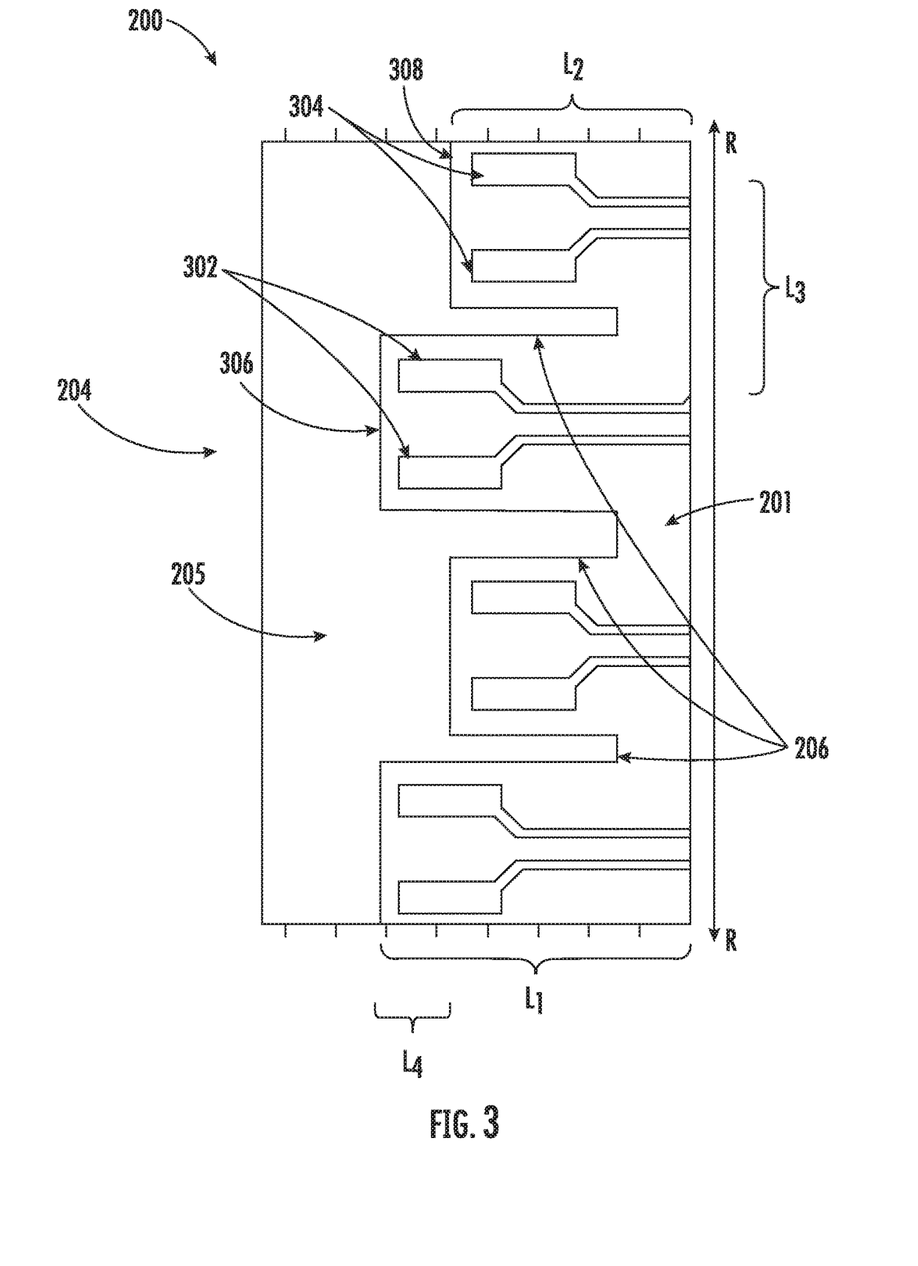
FIG. 3 is a top view of a printed circuit board (PCB) of the network connection assembly of FIG. 2 according to an example embodiment.

With reference to FIGS. 2-3, in an operational configuration, at least a first soldering pad pair (e.g., a first soldering pad pair 302 in FIG. 3) and a second soldering pad pair (e.g., a second soldering pad pair 304 in FIG. 3) is each attached to a corresponding differential signal cable 212 via a pair of signal wires 214. As shown, in some embodiments, the grounding region 205 may be formed between the first soldering pad 302 and the second soldering pad pair 304 (e.g., grounding region 206) to provide an offset configuration of the soldering pad pairs 208, thereby providing increased grounding area for connecting drain wires 216 to the grounding region 206. In this way, cross-talk (e.g., electrical interference) between the differential signal cable 212 connected with the first soldering pad pair 302 and the differential signal cable 212 connected with the second soldering pad pair 304 may be reduced. By way of example, a differential signal cable 212 may transmit an electrical signal (e.g., a differential signal carried by signal wires 214 from a corresponding network connector assembly on an opposite end of the differential signal cable 212) that is received by the PCB 201 via a connection to the soldering pad pair 208. The electrical signal (e.g., differential signal) may then be transmitted by the electrical trace 210 to a corresponding network connector (not shown) in electrical communication with the soldering pad pair 208. In this way, the offset configuration between adjacent differential signal cables 212 (e.g., between adjacent pairs of signal wires 214) reduces insertion loss deviation and associated signal noise and, therefore, improves resultant signal quality and strength. In this regard, adjacent differential signal cables 212 may be considered "offset" in an instance in which the respective ends of the differential signal cables are not aligned, as shown in FIG. 2.

With reference to FIG. 3, a top cut-away view of the network connection assembly 200 is illustrated. As shown, the PCB 201 may define a first soldering pad pair 302 supported by a first extension 306 of the PCB 201 and a second soldering pad pair 304 supported by a second extension 308 of the PCB 201. As illustrated in FIG. 3 and described hereafter, the PCB 201 may be configured such that the first soldering pad pair 302 is offset from the second soldering pad pair 304 with respect to an edge of the PCB 201 at the second end 204. In this way, the offset configuration operates to decrease cross-talk (e.g., interference) between differential signal cables 212 (e.g., attached via signal wires 214 and soldering pad pairs 208). Although referred to herein as a first extension 306 and a second extension 308, the present disclosure contemplates that these "extensions" may instead refer to regions, portions, areas, or the like that are a part of the PCB 201. Said differently, the PCB 201 may not extend but rather may include areas (e.g., first extension 306 and second extension 308) that support soldering pad pairs such that the grounding region (or a portion of the grounding region) is disposed between adjacent soldering pad pairs (e.g., between "extensions").

With continued reference to FIG. 3, the first extension 306 may define a first length ($L_1$) between a point along a reference line R on the PCB 201 and an edge of the first extension 306 proximate the second end 204 of the PCB 201. The second extension 308 may define a second length ($L_2$) between a corresponding point along the same reference line R on the PCB 201 and an edge of the second extension 308 proximate the second end 204 of the PCB 201. As shown, the first length ($L_1$) is greater than the second length ($L_2$) such that the first extension 306 and the corresponding first soldering pad pair 302 supported thereon are located closer to the second end 204 of the PCB 201 than the second soldering pad pair 304 of the second extension 308. As described above, the grounding region 205 may, in some embodiments, extend between the first soldering pad pair 302 and the second soldering pad pair 304 (e.g., grounding region 206). In this way, in an operational configuration such as shown in FIG. 2, the differential signal cable 212 attached to the first soldering pad pair 302 (e.g., via signal wires 214) and the second soldering pad pair 304 may be connected via drain wires 216 to the grounding region 206 between the adjacent soldering pad pairs. As shown, in an instance in which the first length ($L_1$) is greater than the second length ($L_2$), the grounding region 205 proximate the second end 204 of the PCB 201 may extend between an outer edge of the second extension 308 proximate the second end 204 and an outer edge of the first extension 306 proximate the second end 204 to define a fourth length ($L_4$) between the respective outer edges so as to provide an offset configuration for the differential signal cables 212 attached thereto. In one such embodiment, the fourth length ($L_4$) may be determined in a periodic manner in the range of 0.1 to 5.0 mm. Furthermore, in such an embodiment, a third length ($L_3$) may correspond to the distance between corresponding soldering pads of the adjacent pair of soldering pads such as the pair of soldering pads of the first extension 306 and the pair of soldering pads of the second extension 308, (e.g., soldering pads 208 located in the same relative position within the pair).

Example Method of Manufacture

Figure 4:
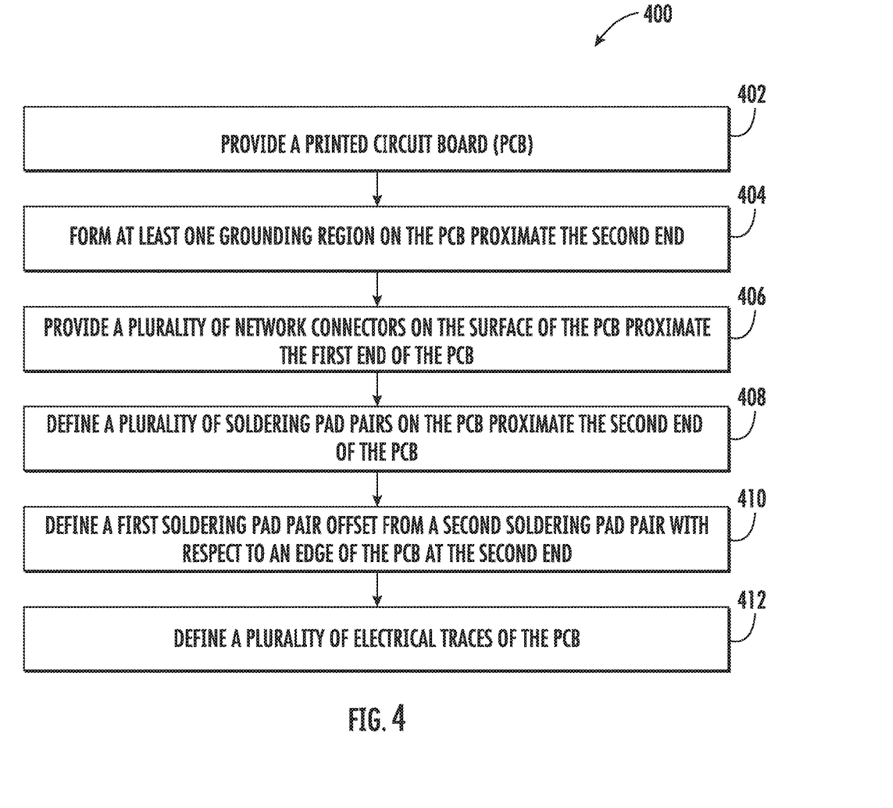
FIG. 4 illustrates a flowchart depicting a method of assembling a network connection assembly according to an example embodiment.

With reference to FIG. 4, a method of manufacturing a PCB for a network connection assembly according to embodiments of the invention is illustrated. The method (e.g., method 400) may include the steps of providing a PCB at Block 402. As described above with reference to FIGS. 2-3, the PCB may define a first end configured to, in an operational configuration, be inserted in, attached to, or otherwise received by a switch module such as those described above with reference to FIG. 1. The PCB may further define a second end that may, in an instance in which the first end of the PCB is received by a switch module, extend outward from the switch module and, via one or more networking cables, may serve to connect the PCB to another PCB on the opposite end of the differential signal cable. The method 600 may further utilize any known means for creating PCBs (e.g., subtractive processes, additive processes, semi-additive processes, chemical etching, copper patterning, lamination, plating and coating, or the like) at Block 402.

The method 400 may further include forming at least one grounding region on the PCB proximate the second end at Block 404. As described above, the grounding region that is proximate the second end of the PCB may, in some embodiments, extend along the entire second end of the PCB. In other embodiments, the grounding region proximate the second end may define a plurality of regions located between adjacent pairs of soldering pads described hereafter. In an operational configuration, the grounding region proximate the second end may be connected to the plurality of soldering pad pairs via one or more drain wires. The method 400 may further include providing a plurality of network connectors on the PCB proximate the first end of the PCB at Block 406. The plurality of network connectors may be located proximate the first end of the PCB, and each network connector may be configured to connect to a corresponding networking device. The network connectors may each be configured to connect to a networking device of any type (e.g., QSFP, Direct Attach Copper, AOC, etc.), and may thus be dimensioned (e.g., sized and shaped) to mate with or otherwise connect to any corresponding networking device.

The method 400 may also include defining a plurality of soldering pad pairs on the PCB proximate the second end of the PCB at Block 408. As described above, the plurality of soldering pad pairs may be located proximate the second end of the PCB, and each soldering pad may be configured to receive a corresponding signal wire of a differential signal cable (e.g., signal wires 214 and differential signal cable 212 in FIG. 2) attached thereto. The soldering pads may each be configured to receive a networking cable of any type or material (e.g., copper, aluminum, etc.) and may be dimensioned (e.g., sized and shaped) to provide sufficient space for attachment with the corresponding signal wires.

The method 400 may define a first soldering pad pair that is offset from a second soldering pad pair with respect to an edge of the PCB at the second end at Block 410. In particular, the grounding region of the PCB may be formed between the first soldering pad pair and the second soldering pad pair to provide an offset configuration of the soldering pad pairs, thereby providing increased grounding area for connecting drain wires to the grounding region as described above. In this way, cross-talk (e.g., electrical interference) between the differential signal cable connected with the first soldering pad pair and the differential signal cable connected with the second soldering pad pair may be reduced. As noted above, the offset configuration between adjacent differential signal cables (e.g., pairs of signal wires) reduces insertion loss deviation and associated signal noise and, therefore, improves resultant signal quality and strength.

The method 400 may further include defining a plurality of electrical traces of the PCB at 412. The electrical traces may be configured to provide electrical communication between a network connector and a corresponding differential signal cable attached to a corresponding soldering pad (e.g., via signal wires of the differential signal cable) such that electrical signals may pass therebetween. The electrical traces may, in some embodiments, be attached to a surface of the PCB or may, in some embodiments, be defined by the surface of the PCB. In some embodiments, one or more of the electrical traces may pass between opposite surfaces of the PCB, such as by passing through the PCB, to enable electrical communication between different surfaces of the PCB.

Many modifications and other embodiments of the inventions set forth herein will come to mind to one skilled in the art to which these inventions pertain having the benefit of the teachings presented in the foregoing descriptions and the associated drawings. Although the figures only show certain components of the methods and systems described herein, it is understood that various other components may also be part of any optical component or optoelectronic element. In addition, the method described above may include fewer steps in some cases, while in other cases may include additional steps. Modifications to the steps of the method described above, in some cases, may be performed in any order and in any combination.

Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A substrate assembly for a network connection comprising:
a printed circuit board (PCB), wherein the PCB defines:
a first end,
a second end, and
at least one grounding region on the PCB proximate the second end;
a plurality of network connectors disposed on the PCB proximate the first end of the PCB, wherein each network connector is configured to receive a corresponding networking device connected thereto;
a plurality of soldering pad pairs disposed on the PCB proximate the second end of the PCB, wherein each soldering pad pair is configured to receive a differential signal cable such that each soldering pad in the soldering pad pair receives a signal wire of the differential signal cable attached thereto; and
a plurality of electrical traces defined by the PCB, wherein each electrical trace is configured to provide electrical communication between a network connector and a corresponding soldering pad such that electrical signals may pass therebetween,
wherein at least a first soldering pad pair is offset from a second soldering pad pair with respect to an edge of the PCB at the second end, such that, in an operational configuration in which at least the first soldering pad pair and the second soldering pad pair receive a differential signal cable, each differential signal cable is supported by the PCB in a corresponding offset configuration thereby reducing cross-talk between the differential signal cables.

2. The substrate assembly according to claim 1, wherein the PCB defines at least a first extension supporting the first soldering pad pair and a second extension supporting the second soldering pad pair, wherein the first extension and the second extension are located such that at least a portion of the at least one grounding region proximate the second end is disposed between the first extension and the second extension.

3. The substrate assembly according to claim 2, wherein the first extension defines a first length and the second extension defines a second length, wherein the first length is greater than the second length.

4. The substrate assembly according to claim 2, further comprising one or more drain wires connected between each differential signal cable and the at least one grounding region proximate the second end.

5. The substrate assembly according to claim 4, wherein at least one of the one or more drain wires of the differential signal cable received by the first soldering pad pair or the differential signal cable received by the second soldering pad pair is connected to the grounding region between the first extension and the second extension.

6. The substrate assembly according to claim 2, wherein the distance between corresponding soldering pads of the first soldering pad pair and the second soldering pad pair is approximately 1.4 mm.

7. The substrate assembly according to claim 1, wherein the PCB further comprises:
a first surface supporting the plurality of network connectors disposed proximate the first end of the PCB and supporting the plurality of soldering pad pairs disposed proximate the second end of the PCB; and
a second surface opposite the first surface, the second surface supporting a plurality of network connectors disposed on the second surface of the PCB proximate the first end of the PCB and supporting a plurality of soldering pad pairs disposed on the second surface of the PCB proximate the second end of the PCB.

8. A network connection assembly comprising:
a printed circuit board (PCB), wherein the PCB defines:
a first end;
a second end;
at least one grounding region on the PCB proximate the second end;
a plurality of network connectors proximate the first end of the PCB, wherein each network connector is configured to receive a corresponding networking device connected thereto;
a plurality of soldering pad pairs proximate the second end of the PCB, wherein each soldering pad pair is configured to receive a differential signal cable; and
a plurality of electrical traces, wherein each electrical trace is configured to provide electrical communication between a network connector and a corresponding soldering pad such that electrical signals may pass therebetween; and
a plurality of differential signal cables, wherein each differential signal cable comprises a pair of signal wires such that each differential signal cable is in electrical communication with the PCB via attachment between the pair of signal wires and a corresponding soldering pad pair,
wherein at least a first differential signal cable is offset from a second differential signal cable with respect to an edge of the PCB at the second end such that cross-talk between the differential signal cables is reduced.

9. The network connection assembly according to claim 8, wherein the PCB defines at least a first extension supporting a first soldering pad pair and a second extension supporting a second soldering pad pair, wherein the first extension and the second extension are located such that at least a portion of the at least one grounding region proximate the second end is disposed between the first extension and the second extension.

10. The network connection assembly according to claim 9, wherein the first extension defines a first length and the second extension defines a second length, wherein the first length is greater than the second length.

11. The network connection assembly according to claim 9, further comprising one or more drain wires connected between each differential signal cable and the at least one grounding region proximate the second end.

12. The network connection assembly according to claim 11, wherein at least one of the one or more drain wires of the first differential signal cable or the second differential signal cable is connected to the grounding region between the first extension and the second extension.

13. The network connection assembly according to claim 9, wherein the distance between corresponding soldering pads of the first soldering pad pair and the second soldering pad pair is approximately 1.4 mm.

14. The network connection assembly according to claim 8, wherein the PCB further comprises:
a first surface supporting the plurality of network connectors disposed proximate the first end of the PCB and supporting the plurality of soldering pad pairs disposed proximate the second end of the PCB; and a second surface opposite the first surface, the second surface supporting a plurality of network connectors disposed on the second surface of the PCB proximate the first end of the PCB and supporting a plurality of soldering pad pairs disposed on the second surface of the PCB proximate the second end of the PCB.

15. A method of manufacturing a printed circuit board (PCB) for a network connection assembly, wherein the PCB has a first end and a second end, the method comprising:

forming at least one grounding region on the PCB proximate the first end;

providing a plurality of network connectors on the PCB proximate the first end of the PCB, wherein each network connector is configured to connect to a corresponding networking device;

defining a plurality of soldering pad pairs on the PCB proximate the second end of the PCB, wherein each soldering pad is configured to receive a differential signal cable such that each soldering pad in the soldering pad pair receives a signal wire of the differential signal cable attached thereto; and defining a plurality of electrical traces, wherein each electrical trace is configured to provide electrical communication between a network connector and a corresponding soldering pad such that electrical signals may pass therebetween, wherein the PCB is formed such that at least a first soldering pad pair is offset from a second soldering pad pair with respect to an edge of the PCB at the second end.

16. The method according to claim 15, further comprising defining at least a first extension supporting the first soldering pad pair and a second extension supporting the second soldering pad pair, wherein the first extension is adjacent the second extension and the first extension and the second extension are located such that the grounding region proximate the second end is disposed between the first extension and the second extension.

17. The method according to claim 16, wherein the first extension defines a first length and the second extension defines a second length, wherein the first length is greater than the second length.

18. The method according to claim 14, wherein the grounding region disposed between the first extension and the second extension is configured to receive one or more drain wires attached thereto.

19. The method according to claim 16, wherein the distance between corresponding soldering pads of the first soldering pad pair and the second soldering pad pair is approximately 1.4 mm.

20. The method according to claim 15, further comprising:

providing the plurality of network connectors on a first surface of the PCB proximate the first end of the PCB;

defining the plurality of soldering pad pairs on the first surface of the PCB proximate the second end of the PCB;

providing a plurality of network connectors on a second surface of the PCB proximate the first end of the PCB; and defining a plurality of soldering pad pairs on the second surface of the PCB proximate the second end of the PCB.

* * * * *